(12) United States Patent
Faykosh et al.

(10) Patent No.: US 6,719,848 B2
(45) Date of Patent: Apr. 13, 2004

(54) CHEMICAL VAPOR DEPOSITION SYSTEM

(75) Inventors: Gary T. Faykosh, Perrysburg, OH (US); James B. Foote, Toledo, OH (US); James E. Hinkle, Temperance, MI (US)

(73) Assignee: First Solar, LLC, Perrysburg, OH (US)

( * ) Notice: Subject to any disclaimer, the term of this patent is extended or adjusted under 35 U.S.C. 154(b) by 133 days.

(21) Appl. No.: 09/931,470

(22) Filed: Aug. 16, 2001

(65) Prior Publication Data

US 2003/0033982 A1 Feb. 20, 2003

(51) Int. Cl.[7] .............................................. C23C 16/00
(52) U.S. Cl. ........................ 118/718; 118/725; 118/729; 118/733
(58) Field of Search ................................. 118/718, 725, 118/729, 733, 719; 414/156, 157, 159, 211, 939; 156/345.2, 345.22, 345.31

(56) References Cited

U.S. PATENT DOCUMENTS

| | | | | | |
|---|---|---|---|---|---|
| 2,391,970 A | * | 1/1946 | Holleran et al. | ............ | 219/388 |
| 3,223,498 A | * | 12/1965 | Davidson | .................... | 65/25.2 |
| 3,541,293 A | * | 11/1970 | MacDonald et al. | ........ | 219/390 |
| 3,658,585 A | * | 4/1972 | Folkmann et al. | | |
| 3,868,106 A | * | 2/1975 | Donckel et al. | ............ | 277/345 |
| 4,040,372 A | * | 8/1977 | Flanders | ........................ | 413/9 |
| 4,588,660 A | * | 5/1986 | Shimizu et al. | ................ | 429/35 |
| 4,591,374 A | * | 5/1986 | Klemola | ....................... | 65/350 |
| 4,920,917 A | * | 5/1990 | Nakatani et al. | ............. | 118/718 |
| 5,028,250 A | * | 7/1991 | Deb et al. | ...................... | 65/289 |
| 5,248,349 A | | 9/1993 | Foote et al. | | |
| 5,368,648 A | | 11/1994 | Sekizuka | | |
| 5,372,646 A | | 12/1994 | Foote et al. | | |
| 5,413,671 A | * | 5/1995 | Ketchum | ...................... | 216/37 |
| 5,470,397 A | | 11/1995 | Foote et al. | | |
| 5,536,333 A | | 7/1996 | Foote et al. | | |
| 5,589,007 A | * | 12/1996 | Fujioka et al. | .............. | 136/249 |
| 5,614,249 A | * | 3/1997 | Mayeda | ......................... | 427/8 |
| 5,772,715 A | | 6/1998 | McMaster et al. | | |
| 5,921,559 A | | 7/1999 | Aihara | | |
| 5,938,851 A | * | 8/1999 | Moshtagh | .................... | 118/715 |
| 5,945,163 A | | 8/1999 | Powell et al. | | |
| 6,037,241 A | | 3/2000 | Powell et al. | | |
| 6,236,021 B1 | * | 5/2001 | Fair et al. | ..................... | 219/388 |
| 2001/0017294 A1 | * | 8/2001 | Aoki et al. | .................. | 219/390 |

FOREIGN PATENT DOCUMENTS

WO    WO 98/31848    7/1998

* cited by examiner

Primary Examiner—P. Hassanzadel
Assistant Examiner—Karla Moore
(74) Attorney, Agent, or Firm—Fish & Richardson P.C.

(57) ABSTRACT

A chemical vapor deposition system (10) includes a housing (12) having an entry (30) and an exit (32) through which glass sheet substrates (G) to be coated are introduced and exited from a deposition chamber (14) defined by lower and upper housing portions (16, 18) having a seal assembly (22) at their horizontal junction which is higher than both the entry and the exit.

20 Claims, 4 Drawing Sheets

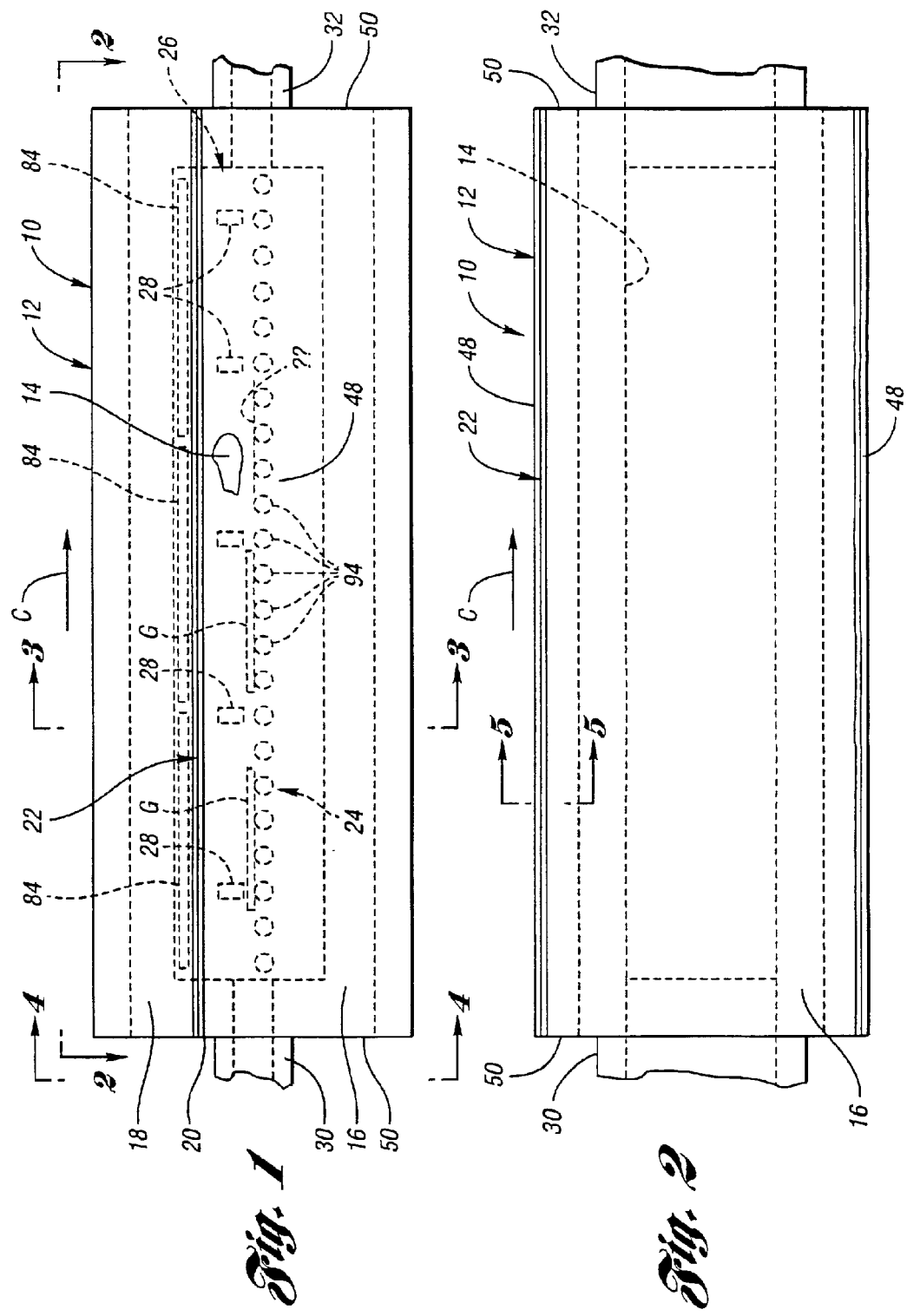

CHEMICAL VAPOR DEPOSITION SYSTEM

BACKGROUND OF THE INVENTION

1. Field of the Invention

This invention relates to a chemical vapor deposition system for depositing coatings on glass sheet substrates.

2. Background Art

Coatings have previously been applied to glass sheet substrates to make semiconductor devices such as photovoltaic panels. One way in which such coatings are applied is by chemical vapor deposition. Close-spaced sublimation was previously utilized to apply coatings such as cadmium sulfide and cadmium telluride to a glass sheet substrate by inserting the substrate on a batch basis into a sealed chamber that is then heated. The glass sheet substrate in close-spaced sublimation is supported at its periphery in a very close relationship, normally two to three millimeters, to a source of material of cadmium telluride. The heating by such a process proceeds to about 450° to 500° C. whereupon the cadmium telluride begins to sublime very slowly into elemental components and, upon reaching an temperature of about 650° to 725° C., the sublimation is at a greater rate and the elemental components recombine at a significant rate on the downwardly facing surface of the substrate.

Continuous processing of thin films onto glass sheet substrates is disclosed by U.S. Pat. No. : 5,248,349 Foote et al., U.S. Pat. No. 5,372,646 Foote et al., U.S. Pat. No. 5,470,397 Foote et al., and U.S. Pat. No. 5,536,333 Foote et al. The chemical vapor deposition utilized to provide the continuous coating is performed within an oven that defines a heated chamber and that is located within an enclosure. A roll conveyor has rolls that extend through the oven to support a glass sheet substrate on which the coating is performed and a drive mechanism located internally of the enclosure but externally of the oven drives the ends of the conveyor rolls which project outwardly from the oven. Also, U.S. Pat. No. 5,945,163 Powell et al. and U.S. Pat. No. 6,037,241 Powell et al. disclose apparatus for performing chemical vapor deposition wherein the gaseous material to be deposited is passed through a heated permeable membrane from a material supply for deposition on the substrate.

SUMMARY OF THE INVENTION

An object of the present invention is to provide an improved chemical vapor deposition system for providing coatings on glass sheet substrates.

In carrying out the above object, the chemical vapor deposition system of the invention includes a housing that defines an enclosed deposition chamber and includes a lower portion and an upper portion having a horizontal junction with each other. A seal assembly extends between the lower and upper housing portions at their horizontal junction to seal the deposition chamber. A roll conveyor located within the deposition chamber conveys glass sheet substrates along a direction of conveyance at a plane of conveyance below the horizontal junction of the lower and upper housing portions where the seal assembly is located. A chemical vapor distributor is located within the deposition chamber above the roll conveyor to provide chemical vapor deposition of a coating on the conveyed glass sheet substrates. The housing includes an entry through which the glass sheet substrates to be coated are introduced into the deposition chamber at a location below the horizontal junction of the lower and upper housing portion where the seal assembly is located, and the housing also includes an exit through which the coated glass sheet substrates leave the deposition chamber at a location below the horizontal junction of the lower and upper housing portions where the seal assembly is located.

The deposition system includes a vacuum source for drawing a vacuum within the deposition chamber. The seal assembly between the lower and upper housing portions includes inner and outer seal members spaced from each other to define an intermediate seal space that is located between the deposition chamber and the ambient and in which a vacuum is drawn to a lesser extent than in the deposition chamber. A sensor detects the pressure within the seal space to sense leakage of either the inner seal member or the outer seal member. The seal assembly includes lower and upper seal flanges on the lower and upper housing portions, and the inner and outer seal members extend between the lower and upper seal flanges to seal between the lower and upper housing portions. Clamps extend between the lower and upper seal flanges to secure the upper housing portion to the lower housing portion. Each clamp includes a hydraulic cylinder operable to provide the securement between the lower and upper seal flanges.

The deposition system includes an oven located within the housing and having elongated heaters that extend along the direction of conveyance in laterally spaced banks to heat the conveyed glass sheet substrates and control temperature differentials of the substrates laterally with respect to the direction of conveyance. Each elongated heater includes an electric resistance element through which electricity is passed to provide heating, and each heater includes an elongated quartz tube through which the electric resistance element extends. The roll conveyor includes rolls that extend through the oven and have ends projecting outwardly therefrom within the housing, and a drive mechanism engages and rotatively drives the roll ends outwardly of the oven within the housing.

The deposition system also includes a screen that is located below the roll conveyor to catch any broken glass sheet substrates. The screen is made of stainless steel and includes stiffeners.

The objects, features and advantages of the present invention are readily apparent from the following detailed description of the preferred embodiment when taken in connection with the accompanying drawings.

BRIEF DESCRIPTION OF THE DRAWINGS

FIG. 1 is a schematic side elevational view of a chemical vapor deposition system that is constructed in accordance with the present invention.

FIG. 2 is a top plan view of the deposition system taken along the direction of line 2—2 in FIG. 1.

DETAILED DESCRIPTION OF THE PREFERRED EMBODIMENT

Figure 3:
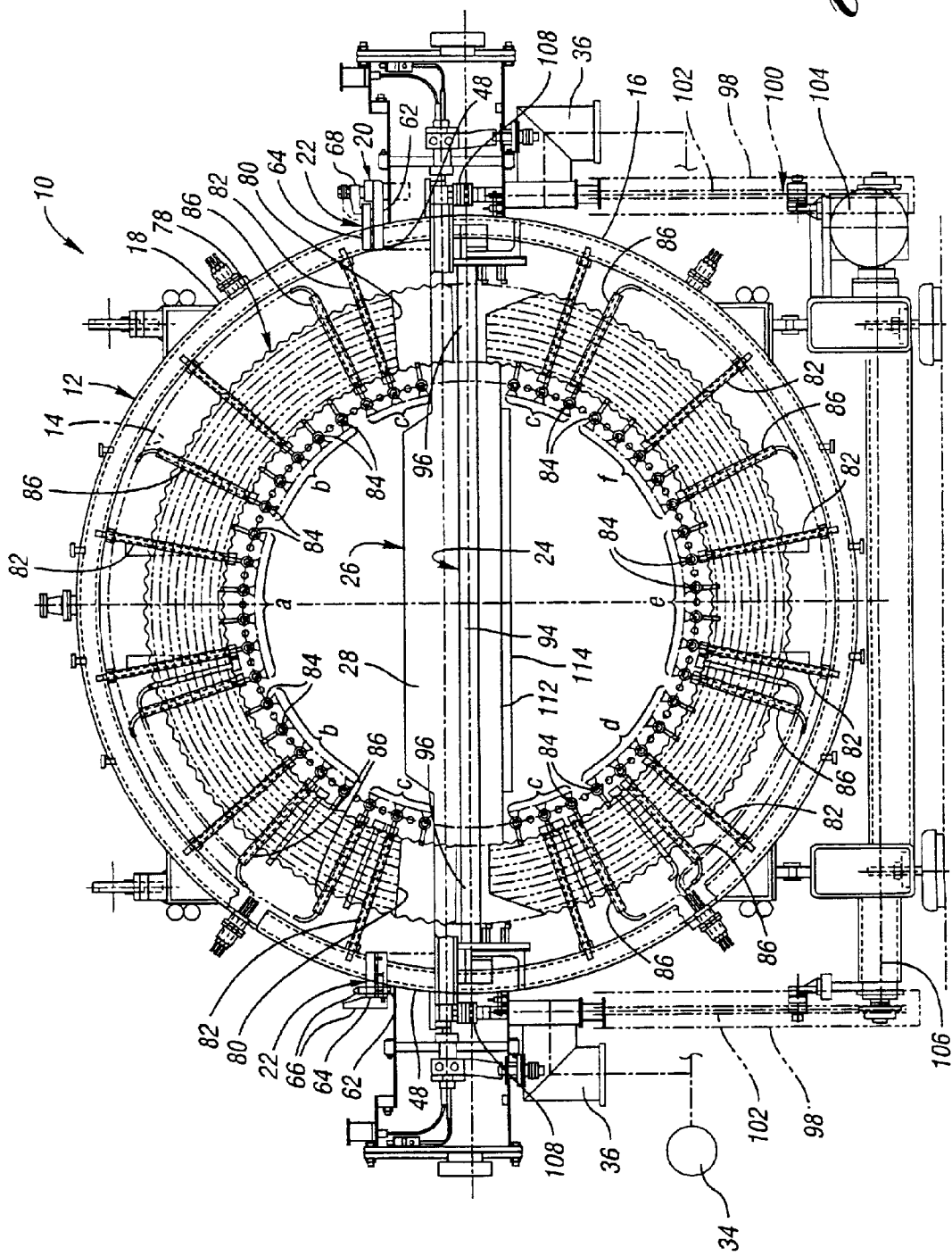
FIG. 3 is a cross sectional view through the deposition system taken along the direction of line 3—3 in FIG. 1.

With reference to FIGS. 1 and 2, a chemical vapor deposition system constructed in accordance with the present invention is generally indicated by 10 and includes a housing 12 that defines an enclosed deposition chamber 14 in which chemical vapor deposition takes place as is hereinafter more fully described. The housing 12 as shown in FIG. 1 includes a lower portion 16 and an upper portion 18 that have a horizontal planar junction 20 with each other. A seal assembly 22 extends between the lower and upper housing portions 16 and 18 at their horizontal junction 20 to seal the housing 12. This seal assembly extends along each lateral side of the elongated length of the system housing and along each of its opposite ends so as to extend completely around the housing.

As illustrated by combined reference to FIGS. 1 and 3, a roll conveyor 24 is located within the deposition chamber 14 to convey glass sheet substrate G along a direction of conveyance C at a plane of conveyance that is identified by pc in FIG. 1. This plane of conveyance pc is located below the horizontal junction 20 of the lower and upper housing portions 16 and 18 where the seal assembly 22 is located.

With further reference to FIGS. 1 and 3, a chemical vapor distributor collectively indicated by 26 includes distributor plenums 28 that are located within the deposition chamber 14 above the roll conveyor 24 to provide chemical vapor deposition of a coating on the conveyed glass sheet substrates. The distributor plenums 28 are preferably of the type disclosed by U.S. Pat. No. 5,945,163 Powell et al. and U.S. Pat. No. 6,037,241 Powell et al., the entire disclosures of which are hereby incorporated by reference, wherein the chemical vapor to be deposited is passed through a heated permeable membrane prior to being discharged for flow downwardly toward the roll conveyor onto the adjacent conveyed glass sheet substrate for the deposition.

Figure 4:
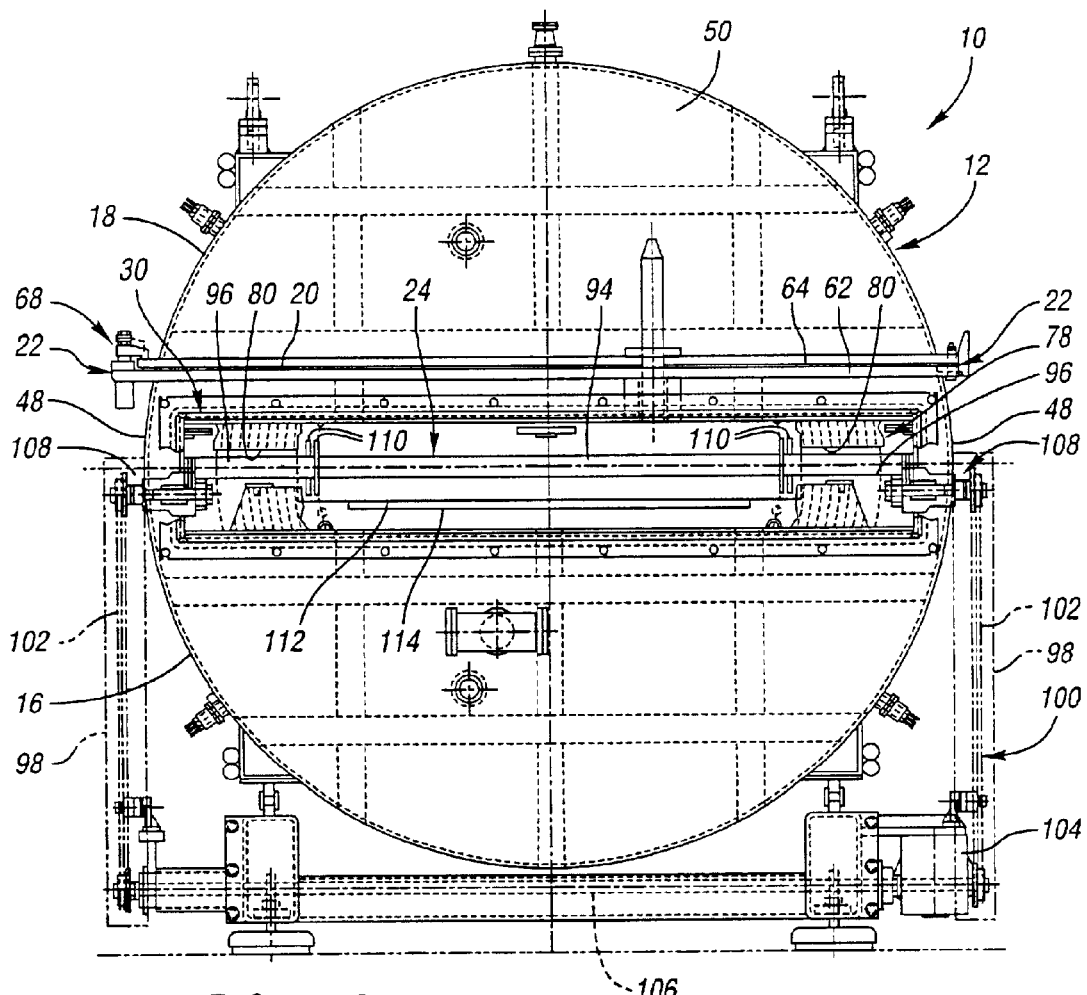
FIG. 4 is an elevational view of the system taken along the direction of line 4—4 in FIG. 1 at the left entry end and is also illustrative of the right exit end.

As illustrated in FIGS. 1 and 4, the housing includes an entry 30 through which the glass sheet substrates to be coated are introduced into the deposition chamber 14 about a location below the horizontal junction 20 of the lower and upper housing portions 16 and 18 where the seal assembly 22 is located. In addition, the housing as shown in FIG. 1 includes an exit 32 through which the coated glass sheet substrates leave the deposition chamber 14 at a location below the horizontal junction 20 of the lower and upper housing portions 16 and 18 where the seal assembly 22 is located. The entry 30 and exit 32 as illustrated by the entry shown in FIG. 4 function as open passways between other processing systems. For example, the entry 30 can receive heated glass sheets from a heating furnace for the deposition, and the exit 32 can transfer the coated glass sheets for further processing. In that case, the other system portions will have suitable seals that maintain the contained environment therein as well as within the deposition system 10. Such seals can be conventional load lock cells with spaced gates and evacuation pumping apparatus for providing the glass sheet introduction in a conventional manner without any introduction of the environmental atmosphere into the deposition chamber 14. In addition, it is also possible for the entry 30 and exit 32 to be load lock cells or any type of suitable engagement seals or a slit seal for permitting continuous introduction of glass sheets such as disclosed by U.S. Pat. No. 5,772,715 McMaster et al., the entire disclosure of which is hereby incorporated by reference.

As illustrated in FIG. 3, the chemical vapor distributor 26 has a material source 34 that feeds a pair of inlets 36 to opposite lateral sides of the system for flow to the opposite lateral ends of the distributor plenums 28 in order to ensure uniform distribution of the deposition on the glass sheet substrates as they are conveyed along the roll conveyor 24.

Figure 5:
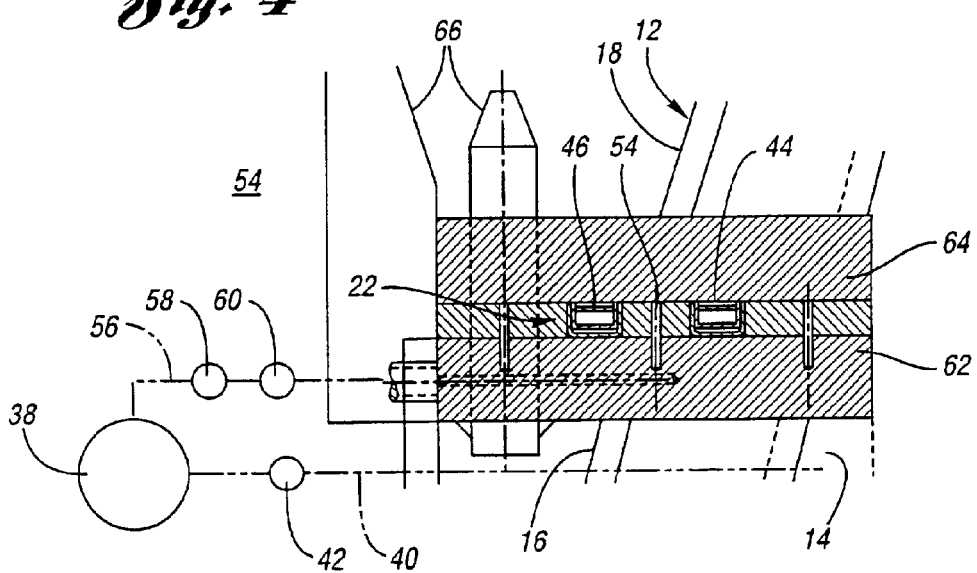
FIG. 5 is a sectional view taken along the direction of line 5—5 in FIG. 2 to illustrate the construction of a seal assembly of the deposition system housing.

As illustrated in FIG. 5, the chemical vapor deposition system 10 includes a vacuum source 38 for drawing a vacuum in the deposition chamber 14 through a conduit 40 under the control of a valve 42. The seal assembly 22 between the lower and upper housing portions 16 and 18 includes inner and outer seal members 44 and 46 that extend around the entire periphery of the housing 12 at its elongated lateral sides 48 shown in FIG. 2 as well as its opposite ends 50. The inner and outer seal members 44 and 46 are spaced from each other to define an intermediate seal space 54 shown in FIG. 5. This seal space is thus located between the deposition chamber 14 and the ambient 54. A vacuum is drawn in the intermediate seal space 54 through a conduit 56 under the control of a valve 58 so as to be of a lesser vacuum than the vacuum in the deposition chamber 14. A sensor functions to sense the level of the vacuum in the intermediate seal space 54 to sense leakage of the inner seal member 44 or the outer seal member 46. More specifically, when the sensor 60 senses an increase in the vacuum in the intermediate seal space 54, there is an indication that the inner seal member 44 is permitting leakage. Conversely, when the sensor 60 senses a decrease in the vacuum in the intermediate seal space 54, there is an indication that the outer seal member 46 is leaking. Thus, the system can monitor both the inner and outer seal members 44 and 46 of the seal assembly 22 to ensure its effective sealing function.

Figure 6:
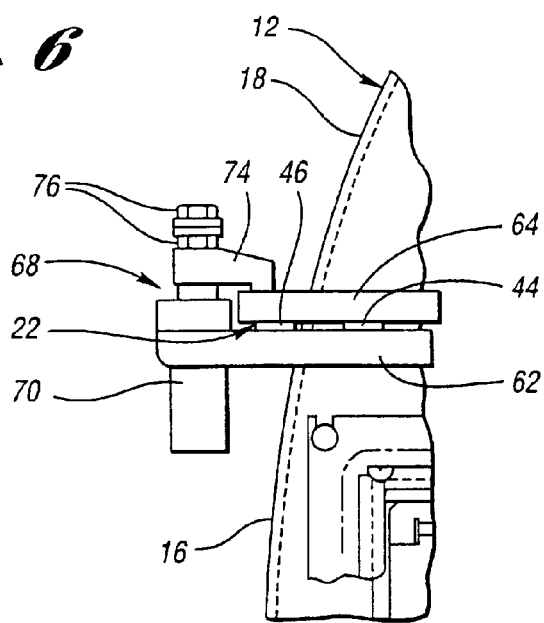
FIG. 6 is an enlarged view of a portion of FIG. 4 to illustrate the construction of clamps that secure seal flanges of lower and upper housing portions of the system housing.

As illustrated in FIGS. 4 and 5, the seal assembly 22 includes lower and upper seal flanges 62 and 64 on the lower and upper housing portions 16 and 18. The inner and outer seal members 44 and 46 extend between the lower and upper seal flanges 62 and 64 as shown in FIG. 5 to seal between the lower and upper housing portions. Upon downward movement of the upper housing portion 18 onto the lower housing portion 16, guides 66 provide proper positioning of the upper housing portion. Clamps 68 shown in FIGS. 4 and 6 are spaced around the periphery of the housing to secure the seal flanges to each other. More specifically as illustrated in FIG. 6, each clamp has a hydraulic cylinder 70 mounted on the lower seal flange 62 and also has a movable clamp member 74 that engages the upper seal flange 64 and is secured by at least one threaded connector 76 to a piston connecting rod of the hydraulic cylinder.

Figure 7:
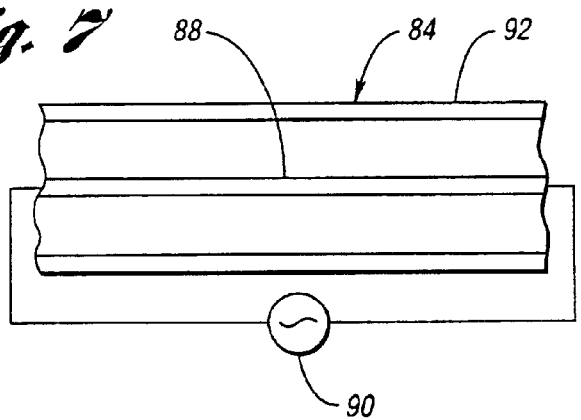
FIG. 7 is a view illustrating the construction of elongated heaters of an oven of the deposition system.

As illustrated in FIG. 3, the chemical vapor deposition system 10 includes an oven 78 that is located within the housing 12 and has an elongated length corresponding to the length of the housing 12, and the oven has opposite lateral slots 80 through which the roll conveyor 24 and the chemical vapor distributor 26 project from the heated oven. The oven 78 has an insulated construction and is mounted on the housing 12 by supports 82 that extend generally radially with respect to the generally circular shape of the housing and the oven. Within its interior, the oven 78 includes elongated heaters 84 that extend along the length of the housing. Electrical connectors 86 connect the heaters 84 in banks a, b, c, d, and e to control temperature differentials of the glass sheet substrates laterally with respect to the direction of conveyance as well as controlling heating of their upper and lower surfaces to compensate for any radiation and conduction of the lower substrate surfaces provided by the roll conveyor 24. Each electrical heater 84 as illustrated in FIG. 7 has an electric resistance element 88 across which a voltage 90 is applied, and each heater 84 includes an elongated quartz tube 92 through which the associated electric resistance elements 88 extend so as to be protected.

As illustrated in FIG. 1, the roll conveyor 24 includes a plurality of rolls 94 spaced along the direction of conveyance C along the elongated direction of the direction of conveyance. These conveyor rolls 94 as shown in FIG. 4 have ends 96 that project outwardly from the oven 78 through its side slots 80, respectively, adjacent the lateral sides of the housing 12. The system housing 12 as illustrated has drive portions 98 whose interiors are in sealed communication with the deposition chamber 14 externally of the oven 78. A drive mechanism collectively indicated by 100 is located within the drive portions 98 of the system housing and has vertically extending drive chains 102 that are driven by a gear box 104 and a cross shaft 106 to drive upper drive gear units 108 that engage and rotatively drive the roll ends 98 eternally of the oven 78 but within the housing 12. As such, the drive mechanism 100 is not subjected to the heating involved with the interior of the oven 78 and can be manufactured more economically to function at a lower temperature.

With continuing reference to FIG. 4, the conveyor rolls 96 are preferably made from sinter bonded fused silica particles and at locations where the chemical vapor distributor plenums are not located may have annular radiation shields 110 that limit radiant heat loss through the oven side slots 80.

Figure 8:
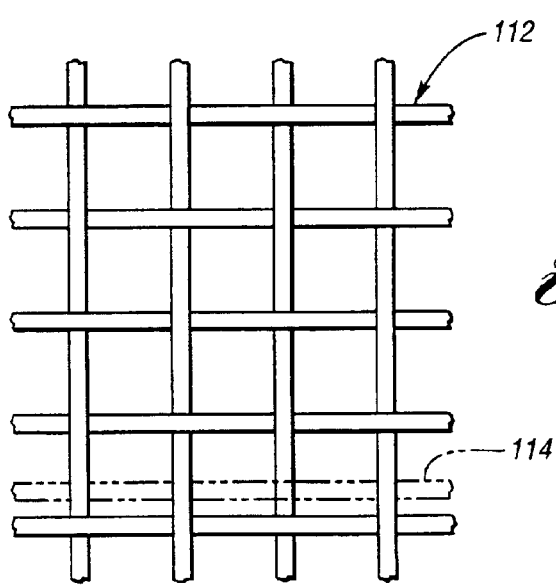
FIG. 8 illustrates the construction of a screen that catches any broken glass sheet substrates to protect heaters in the oven at the lower housing portion.

With reference to FIGS. 3, 4 and 8, the system has a screen 112 that is located below the roll conveyor 24 to catch any broken glass sheet substrates. More specifically, the screen 112 is made of stainless steel and includes suitable stiffeners 114, with the stainless steel screen having openings of about 1 to 2 centimeters so as not to disrupt the radiant heat flow from the lower heaters.

While the best mode for carrying out the invention has been described in detail, those familiar with the art to which this invention relates will recognize various alternative designs and embodiments for practicing the invention as defined by the following claims.

What is claimed is:

1. A chemical vapor deposition system comprising:
    a housing that defines an enclosed deposition chamber and includes a lower portion and an upper portion having a horizontal junction with each other;
    a seal assembly that extends between the lower and upper housing portions at their horizontal junction;
    a roll conveyor located within the deposition chamber to convey glass sheet substrates along a direction of conveyance at a plane of conveyance below the horizontal junction of the lower and upper housing portions where the seal assembly is located;
    a chemical vapor distributor located within the deposition chamber above the roll conveyor to provide chemical vapor deposition of a coating on the conveyed glass sheet substrates;
    an annular radiation shield at locations adjacent to the chemical vapor distributor;
    the housing including an entry through which the glass sheet substrates to be coated are introduced into the deposition chamber at a location below the horizontal junction of the lower and upper housing portions where the seal assembly is located; and
    the housing including an exit through which the coated glass sheet substrates leave the deposition chamber at a location below the horizontal junction of the lower and upper housing portions where the seal assembly is located.

2. A chemical vapor deposition system as in claim 1 further including a vacuum source for drawing a vacuum within the deposition chamber, the seal assembly between the lower and upper housing portions including inner and outer seal members spaced from each other to define an intermediate seal space that is located between the deposition chamber and the ambient and in which a vacuum is drawn to a lesser extent than in the deposition chamber, and a sensor for detecting the pressure within the seal space to sense leakage of either the inner seal member or the outer seal member.

3. A chemical vapor deposition system as in claim 2 wherein the seal assembly includes lower and upper seal flanges on the lower and upper housing portions, the inner and outer seal members extending between the lower and upper seal flanges to seal between the lower and upper housings, and clamps that extend between the lower and upper seal flanges to secure the upper housing portion to the lower housing portion.

4. A chemical vapor deposition system as in claim 3 wherein each clamp includes a hydraulic cylinder that provides the securement between the lower and upper seal flanges.

5. A chemical vapor deposition system as in claim 1 including an oven located within the housing and having elongated heaters that extend along the direction of conveyance in laterally spaced banks to heat the conveyed glass sheet substrates and control temperature differentials of the substrates laterally with respect to the direction of conveyance.

6. A chemical vapor deposition system as in claim 5 wherein each elongated heater includes an electric resistance element through which electricity is passed to provide heating and each heater including an elongated quartz tube through which the electric resistance element extends comprises an elongated quartz tube having an electric resistance element passing therethrough, wherein the electrical resistance element provides heat when electricity is passed therethrough.

7. A chemical vapor deposition system as in claim 5 wherein the roll conveyor includes rolls that extent through the oven and have ends projecting outwardly therefrom within the housing, and a drive mechanism that rotatively drives the roll ends outwardly of the oven within the housing.

8. A chemical vapor deposition system as in claim 7 further including a screen that is located below the roll conveyor to catch any broken glass sheet substrates.

9. A chemical vapor deposition system 6 as in claim 8 wherein the screen is made of stainless steel and includes stiffeners.

10. A chemical vapor deposition system comprising:
    a housing that defines an enclosed deposition chamber and includes a lower portion and an upper portion having a horizontal junction with each other, and the lower and upper housing portions respectively having lower and upper seal flanges at the horizontal junction of the lower and upper housing portions;
    a vacuum source for drawing a vacuum within the deposition chamber;
    a seal assembly having inner and outer seal members that extend between the lower and upper seal flanges of the lower and upper housing portions at their horizontal junction to seal therebetween, and the inner and outer seal members being spaced from each other to define an intermediate seal space in which a vacuum is drawn between the deposition chamber and the ambient;

a sensor for detecting the pressure within the seal space to sense leakage of either the inner seal member or the outer seal member;

a roll conveyor located within the deposition chamber to convey glass sheet substrates along a direction of conveyance at a plane of conveyance below the horizontal junction of the lower and upper housing portions where the seal assembly is located;

a chemical vapor distributor located within the deposition chamber above the roll conveyor to provide chemical vapor deposition of a coating on the conveyed glass sheet substrates;

the housing including an entry through which the glass sheet substrates to be coated are introduced into the deposition chamber at a location below the horizontal junction of the lower and upper housing portions where the seal assembly is located; and the housing including an exit through which the coated glass sheet substrates leave the deposition chamber at a location below the horizontal junction of the lower and upper housing portions where the seal assembly is located.

11. A chemical vapor deposition system comprising:

a housing that defines an enclosed deposition chamber and includes a lower portion and an upper portion having a horizontal junction with each other, and the lower and upper housing portions respectively having lower and upper seal flanges at the horizontal junction of the lower and upper housing portions;

a vacuum source for drawing a vacuum within the deposition chamber;

a seal assembly having inner and outer seal members that extend between the lower and upper seal flanges of the lower and upper housing portions at their horizontal junction to seal therebetween, and the inner and outer seal members being in spaced from each other to define an intermediate seal space in which a vacuum is drawn between the deposition chamber and the ambient;

a sensor for detecting the pressure within the seal space to sense leakage of either the inner seal member or the outer seal member;

a roll conveyor located within the deposition chamber and having rolls for conveying glass sheet substrates along a direction of conveyance at a plane of conveyance below the horizontal junction of the lower and upper housing portions where the seal assembly is located;

an oven located within the housing with the roll conveyor conveying the glass sheet substrates therethrough, the oven having elongated heaters that extend along the direction of conveyance in laterally spaced banks to heat the conveyed glass sheet substrates and control temperature differentials of the substrates laterally with respect to the direction of conveyance, and each elongated heater including an electric resistance element through which electricity is passed to provide heating and each heater including an elongated quartz tube through which the electric resistance element extends;

a chemical vapor distributor located within the deposition chamber above the roll conveyor to provide chemical vapor deposition of a coating on the conveyed glass sheet substrates;

the housing including an entry through which the glass sheet substrates to be coated are introduced into the deposition chamber at a location below the horizontal junction of the lower and upper housing portions where the seal assembly is located; and the housing including an exit through which the coated glass sheet substrates leave the deposition chamber at a location below the horizontal junction of the lower and upper housing portions where the seal assembly is located.

12. A chemical vapor deposition system comprising:

a housing that defines an enclosed deposition chamber and includes a lower portion and an upper portion having a horizontal junction with each other, and the lower and upper housing portions respectively having lower and upper seal flanges at the horizontal junction of the lower and upper housing portions;

a vacuum source for drawing a vacuum within the deposition chamber;

a seal assembly having inner and outer seal members that extend between the lower and upper seal flanges of the lower and upper housing portions at their horizontal junction to seal therebetween, and the inner and outer seal members being in spaced from each other to define an intermediate seal space in which a vacuum is drawn between the deposition chamber and the ambient;

clamps that each include a hydraulic cylinder for securing the lower and upper seal flanges to each other;

a sensor for detecting the pressure within the seal space to sense leakage of either the inner seal member or the outer seal member;

a roll conveyor located within the deposition chamber and having rolls for conveying glass sheet substrates along a direction of conveyance at a plane of conveyance below the horizontal junction of the lower and upper housing portions where the seal assembly is located;

a screen located below the roll conveyor to catch any broken glass sheet substrates;

an oven located within the housing with the roll conveyor conveying the glass sheet substrates therethrough, the oven having elongated heaters that extend along the direction of conveyance in laterally spaced banks to heat the conveyed glass sheet substrates and control temperature differentials of the substrates laterally with respect to the direction of conveyance, and each elongated heater including an electric resistance element through which electricity is passed to provide heating and each heater including an elongated quartz tube through which the electric resistance element extends;

a chemical vapor distributor located within the deposition chamber above the roll conveyor to provide chemical vapor deposition of a coating on the conveyed glass sheet substrates;

the housing including an entry through which the glass sheet substrates to be coated are introduced into the deposition chamber at a location below the horizontal junction of the lower and upper housing portions where the seal assembly is located; and the housing including an exit through which the coated glass sheet substrates leave the deposition chamber at a location below the horizontal junction of the lower and upper housing portions where the seal assembly is located.

13. The chemical vapor deposition system of claim 1 wherein the entry and exit further comprise load lock cells.

14. The chemical vapor deposition system of claim 1 wherein the chemical vapor distributor has an opposing pair of inlets.

15. A chemical vapor deposition system comprising:
an enclosed deposition chamber comprising:
  a housing including a lower portion and an upper portion having a horizontal junction with each other; and
  a seal assembly extending between the lower and upper housing portions at their horizontal junction;
  a roll conveyor extending through the deposition chamber below the horizontal junction of the housing portions; and
  a chemical vapor distributor located within the deposition chamber above the roll conveyor; and
  an annular radiation shield at a location adjacent to the chemical vapor distributor.

16. The chemical vapor deposition system of claim 1 wherein the roll conveyor further comprises conveyor rolls, wherein the conveyor rolls have annular radiation shields at locations adjacent to the chemical vapor distributor.

17. The chemical vapor deposition system of claim 12 wherein the screen has screen openings of 1–2 cm.

18. The chemical vapor deposition system of claim 12 wherein the entry and exit further comprise load lock cells.

19. The chemical vapor deposition system of claim 15 wherein the chemical vapor distributor has an opposing pair of inlets.

20. The chemical vapor deposition system of claim 15 wherein the entry and exit further comprise load lock cells.

* * * * *